(12) United States Patent
Mazoyer et al.

(10) Patent No.: US 7,829,877 B2
(45) Date of Patent: Nov. 9, 2010

(54) MEMORY STRUCTURE WITH A PROGRAMMABLE RESISTIVE ELEMENT AND ITS MANUFACTURING PROCESS

(75) Inventors: Pascale Mazoyer, Domène (FR); Germain Bossu, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 14 days.

(21) Appl. No.: 12/425,223

(22) Filed: Apr. 16, 2009

(65) Prior Publication Data

US 2009/0267046 A1 Oct. 29, 2009

(30) Foreign Application Priority Data

Apr. 16, 2008 (FR) ................... 08 02106

(51) Int. Cl.
*H01L 45/00* (2006.01)
(52) U.S. Cl. .............. 257/3; 257/E45.002; 257/4; 365/148
(58) Field of Classification Search ............ 257/2, 257/3, 4, 5, E45.002, E45.003; 438/95, 99, 438/666; 365/148
See application file for complete search history.

(56) References Cited

U.S. PATENT DOCUMENTS

| 3,217,591 | A | 11/1965 | Barr et al. |
| 3,530,441 | A | 9/1970 | Ovshinsky |
| 7,319,235 | B2 * | 1/2008 | Happ .................. 257/2 |
| 2004/0228172 | A1 | 11/2004 | Rinerson et al. |
| 2005/0006681 | A1 | 1/2005 | Okuno |
| 2005/0285095 | A1 | 12/2005 | Happ |
| 2006/0110530 | A1 | 5/2006 | Suzuki et al. |
| 2007/0147102 | A1 | 6/2007 | Roehr |
| 2008/0173975 | A1 | 7/2008 | Chen et al. |

FOREIGN PATENT DOCUMENTS

WO 2005124788 A2 12/2005

OTHER PUBLICATIONS

Balakrishnan, M. et al., "A Low Power Non-Volatile Memory Element Based on Copper in Deposited Silicon Oxide," Proceedings of the 2006 Non-Volatile Memory Technology Symposium (NVMTS), IEEE, pp. 104-110, Nov. 1, 2006.
Kozicki, M. et al., "A Low-Power Nonvolatile Switching Element Based on Copper-Tungsten Oxide Solid Electrolyte," IEEE Transactions on Nanotechnology 5(5):535-544, Sep. 2006.

* cited by examiner

*Primary Examiner*—Victor A Mandala
*Assistant Examiner*—Scott Stowe
(74) *Attorney, Agent, or Firm*—Lisa K. Jorgenson; Robert Iannucci; Seed IP Law Group PLLC

(57) ABSTRACT

A memory structure has an access transistor connected in series with a programmable resistive element, wherein the programmable resistive element comprises on a semiconductor substrate; an insulated layer with a cavity comprising: a first layer lining the lateral surfaces and the bottom of the said cavity and impermeable to the diffusion of metal; a second layer made of porous material on the said first layer; a third layer of metallic material allowing to realize a contact electrode susceptible to spread within the said formed porous material of the second layer. Diffusion of metallic ions within the said second layer is controlled by the joint action of an electric field and temperature. A manufacturing process is also described.

19 Claims, 3 Drawing Sheets

MEMORY STRUCTURE WITH A PROGRAMMABLE RESISTIVE ELEMENT AND ITS MANUFACTURING PROCESS

BACKGROUND

1. Technical Field

The present disclosure relates to the electronic memories domain and more specifically to a memory structure with an access transistor (TR) connected in series with a programmable resistive element.

2. Description of the Related Art

Programmable electronic memories for a number of years have undergone significant development, in particular with the growth of non-volatile memories which keep the information even when they are not powered and which are widely used in portable electronic devices.

It is desirable to integrate those non-volatile memories into integrated circuits comprising CMOS logic in order to realize full systems (called "system on chip" in the Anglo Saxon literature), including in a same semiconductor product, electronic logic and memory circuits.

The category of non-volatile memories subdivides in three sub-categories, that is rewritable ROM memories (Read Only Memory including PROM, EPROM, EEPROM, and FLASH memories), non-re-writable ROM memories, and memories called RAM (Random Access Memory).

Research regarding RAM memories has enabled the development of ferroelectric-type memories (FeRAM) and magneto resistive memories (MRAM), the latter based on a resistive material controlled by a magnetic field and, more recently, phase change memories (PCM in the Anglo Saxon literature).

Phase change memories (PCM) are based on the use of chalcogenide alloys ($Ge_2$, $Se_2$, $Te_2$) which present two possible phases, respectively disorderly (amorphous) or more orderly (crystalline), distinguished from one another by different resistivity. The transition from one phase to another is controlled by a cycle of heating/cooling and enables then to fix the material in a predetermined phase representative of a given information, a "0" or a "1".

U.S. Pat. Nos. 3,271,591 and 3,530,441 describe the use of phase change material (PCM) to realize programmable memory elements.

Another known technique allowing realization of a programmable resistive memory element is based on the use of a solid electrolyte and the dissolution of metal in the electrolyte using a current or an electric field. The international application WO 2005/124788 entitled "*Nanoscale Programmable Structures and methods of forming and using the same*" from M. KOZICKI, illustrates such a technique of realization of a programmable memory cell.

The use of techniques outlined above has interesting advantages because of significant space savings offered by the memory cell which may be formed with one access transistor. Drawbacks remain, in particular related to the high number of photolithography steps used by these techniques.

For these reasons in particular, alternative techniques to achieve cells and memory circuits based on programmable resistive elements are the subject of much research.

BRIEF SUMMARY

One embodiment is an alternative technique enabling realization of a non-volatile memory cell based on a programmable resistive material.

One embodiment realizes a non-volatile memory that can be easily integrated with logic circuits within a same semi conductor product and that, in addition, achieves high density, rapid memory access, and a limited power consumption.

One embodiment is a memory structure with an access transistor (TR) connected in series with a programmable resistive element (EM), wherein the programmable resistive element includes:

- on a semiconductor substrate an insulating layer (170) having a cavity;
- a first layer (140) lining the lateral surfaces and the bottom of the cavity and impermeable to the diffusion of metal;
- a second layer (150) made of porous material on the first layer;
- a third layer (160) of metallic material allowing to realize a contact electrode susceptible to spread within the said formed porous material of the second layer.

Diffusion of metallic ions within the second layer is controlled by the joint action of an electric field and temperature.

In a particular mode of realization, the first layer is made of tantalum nitride/tantalum (TaN—Ta) or titanium nitride/titanium (TiN—Ti).

In a particular mode of realization, the second layer is made of silicon oxycarbide (SiOC) or germanium oxycarbide (GeOC).

In one embodiment the third layer is a metal with high diffusion, such as copper for example.

In a particular mode of realization, an intermediate layer is arranged under the memory point, and includes a metallic via, for example in tungsten, insulated by a barrier layer of Ta—N.

One embodiment is an electrically programmable non-volatile memory device comprising a memory map formed of a matrix of memory cells each formed of one access transistor (TR) and one memory element (EM i,j). The memory element includes:

- on a semi conductor substrate an insulated layer (170) with a cavity;
- a first layer (140) lining the lateral surfaces and the bottom of the cavity and impermeable to the diffusion of metal;
- a second layer (150) made of porous material on the said first layer;
- a third layer (160) of metallic material allowing to realize a contact electrode susceptible to spread within the said formed porous material of the second layer.

Diffusion of metallic ions within the said second layer is controlled by the joint action of an electric field and temperature.

The matrix comprises:

- first groups of cells (CLii) all extending according to a first direction, each first group comprising cells having transistors that are connected together by a first metallization (WLAi), and memory elements (EMi) with upper electrodes that are connected together by a second metallization (WLPi),
- second groups of cells (CLj) all extending according to a second direction, each second group comprising cells having transistors with sources that are connected together by a third metallization (BLj).

The device has means of control, able to apply selected voltages on the first, second and third metallization, in order to selectively program each cell.

One embodiment provides a manufacturing process of a programmable memory structure comprising the following steps:

- providing a substrate;
- depositing an insulated layer with a cavity;

setting a first layer lining the lateral surfaces and the bottom of the said cavity and impermeable to the diffusion of metal;

setting a second layer made of porous material on the said first layer, setting a third layer realized in metallic material presenting a power of diffusion within the said second layer, applying an electric field together with a change in temperature to cause a controlled diffusion of metal atoms of the said third layer within the said second layer.

In one embodiment, the process includes the provision of a first layer of pre-metal dielectric, which is hollowed out to make a well exposing a determined surface of substrate. The process sets down in that cavity a thin layer of TiN lining the sidewalls as well as the bottom of the well in order to realize a first protective barrier. Then the process fills in the well with a metal, such as tungsten, for instance, and performs an operation of chemical mechanical planarization (CMP). The process then sets down a second barrier of material SiC, then a second layer of silicon oxycarbide. The process then realizes the second cavity of the second layer of silicon oxycarbide with a greater cross-section than that of the first cavity. The process sets down then on the inner walls of that second well a third barrier made of TaN—Ta or TiN—Ti and a third thin layer of silicon oxycarbide intended to serve as a programmable resistive element. The remaining cavity is then filled with copper, for example, in order to form an upper contact electrode for the programmable resistive element.

BRIEF DESCRIPTION OF THE SEVERAL VIEWS OF THE DRAWINGS

Other characteristics will appear from reading the description and the drawings below, given only as non-exhaustive examples.

DETAILED DESCRIPTION

Figure 1:
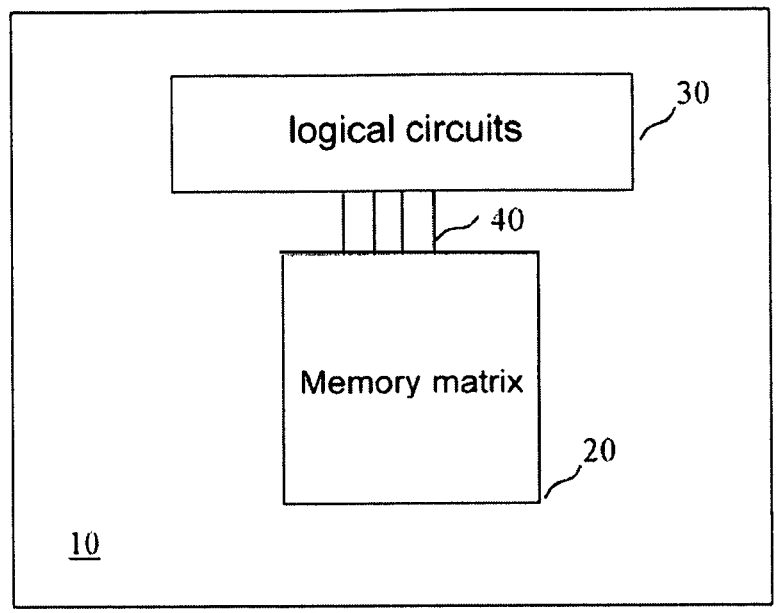
FIG. 1 illustrates a semiconductor product comprising a logic circuit with a matrix of memory cells.

We describe now how to realize a memory element based on a programmable resistive material to achieve an onboard non-volatile RAM, such as that represented in FIG. 1 which illustrates a semiconductor product with a matrix of memory cells 20, arranged in rows and columns, and communicating with logic circuits 30 through circuits 40. The realization of such an "onboard" non-volatile memory RAM on a system on chip therefore represents only one particular embodiment. One skilled in the art may adjust the teaching of the present application to realize a semiconductor product with a single memory.

Figure 2:
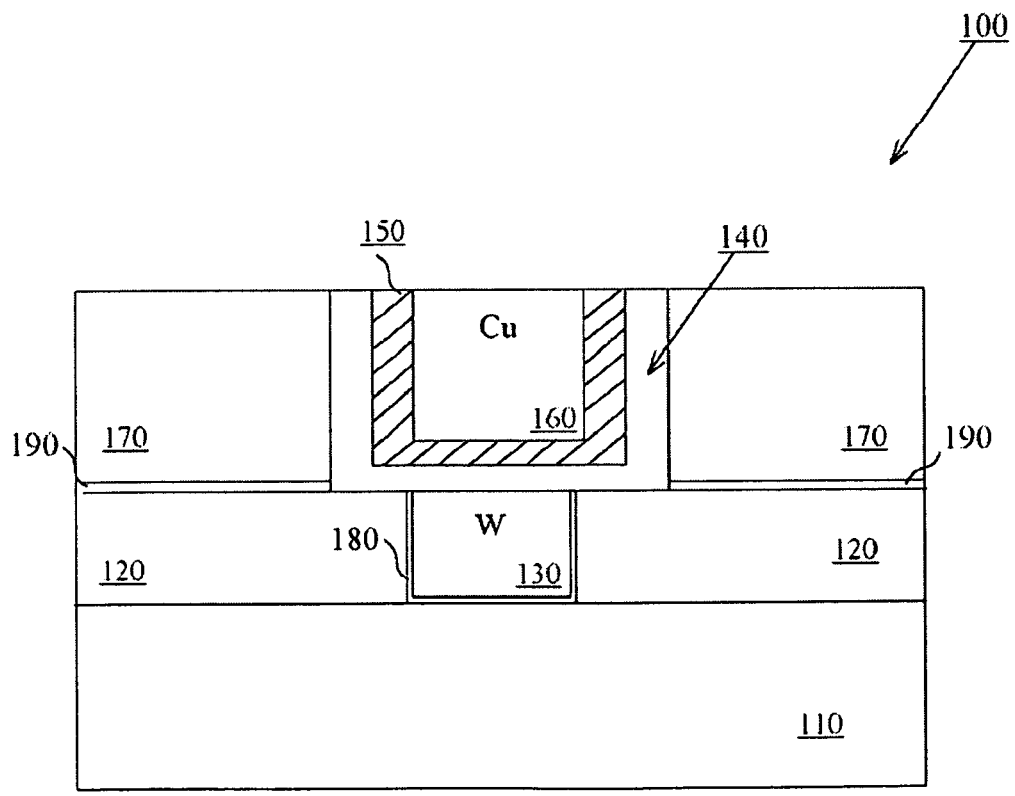
FIG. 2 illustrates the microelectronic structure of a memory element.

In reference to FIG. 2, the structure of a particular mode of realization of a memory element and its manufacturing process is described. Although the description below will describe the fabrication of a single memory element, it is clear that many elements can be made as needed.

Figure 4:
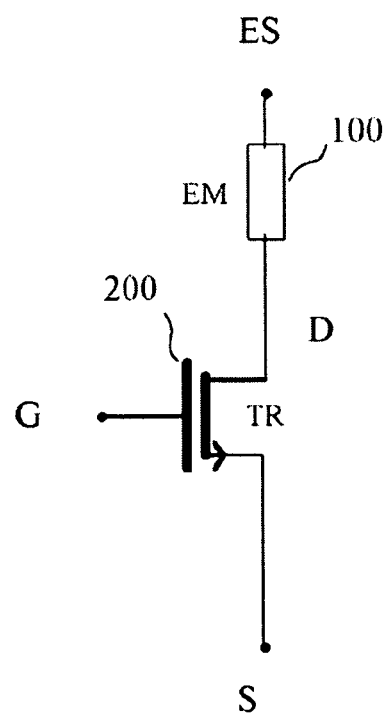
FIG. 4 illustrates the equivalent electric diagram of a memory cell.

First, the process prepares a layer of semiconductor substrate 110, made of silicon (Si), GaS, or SOI (Silicon on insulator in the Anglo-Saxon literature) which may also serve as the medium to the access transistor (shown in FIG. 4) as well as to metallizations forming the worldlines and bitlines of FIG. 4.

In a first step an optional layer 120 of pre-metal dielectric having a conductor via 130 is realized.

For this purpose, the process sets down on the substrate 110, by any means such as a CVD operation (Chemical Vapor Deposition), a layer 120 of pre-metal dielectric (PMD), made of a relevant dielectric such as an oxide, SiOC, BPSG (Boron Phosphorous Silicon Glass), PSG (Phosphorus Silicon Glass) or a silicon nitride.

The layer 120 is then hollowed out to achieve a cavity to expose a determined surface of the substrate 110. The cavity can present any cross-section, rectangular or circular for example and any well-known method of etching can be used.

The process then sets down a thin layer 180 of TiN on the sidewalls and the bottom of the well to achieve a barrier that protects layers 110 and 120 from contamination by a metal compound—such as tungsten (W) for example, that is set down in the cavity to form a via 130 referenced in FIG. 2. Alternatively, the following metals can be used to realize the via 130: nickel, molybdenum, platinum, metal silicides and the following compounds SiOC, BPSG (Boron Phosphorous Silicon Glass), PSG (Phosphorus Silicon Glass).

Once via 130 is realized, an operation of mechanical planarization of type CMP (Chemical Mechanical Planarization) is performed, for example, or by any other operation know to those skilled in the art.

As it has been mentioned above, the layer 120 comprising the metallic via (W) is an option in the process described. Those of skill in the art will be able to adapt the embodiments without realizing the layer 120 and its metallic well 130, but there is some interest to have this intermediate layer 120 with the metallic via 130.

First, an interest comes from the fact that this layer 120 enables the development of structures of transistors that may constitute, in particular, the amplification circuits and selection lines of the memory.

Second, it can be advantageous to use the metallic via 130 to guarantee some thermal inertia as well as good heat conductibility.

Despite technical advantages resulting from the combination of layer 120 and via 130, it should be noted that embodiments are not limited to the use of this layer 120.

Then the process sets down on layer 120 or, when this one is not present, directly on the substrate 110, a layer of material 190 with low permittivity (low-K). The layer 190 can include a material chosen among the family SiC, SiOC, OCGe, GeSiO and satisfying the following three functions:

1) ensure a low permittivity (low-K) to avoid the capacitive type effects in particular;

2) provide some electrical insulation;

3) a stop layer for later etching.

Once layer 190 is in place, the process then sets down a layer 170 of an insulating material with low permittivity, such as a dielectric porous oxide like for example SiOC selected in particular to reduce the dielectric constant value.

A second cavity is then formed within the layer 170. In one embodiment the second cavity has in a larger cross-section than that of the first cavity used to realize the metallic via 130. In one embodiment, this second cavity also presents a circular cross-section like that of via 130.

This second cavity shows a predetermined surface of the PMD layer 120 comprising the metallic via 130.

A thin barrier layer 140 is then deposited on the inner walls of the second cavity, for example of TaN—Ta intended to avoid any diffusion of copper or metal, through the sidewalls of the second cavity, towards the SiOC of layer 170. Alternatively TiN—Ti may be used.

FIG. 2 illustrates a particular embodiment in which the barrier layer 140 covers the entire inner surface of the second cavity realized within the layer 170, but it is not a limiting element.

The process then arranges, within the second cavity, a second thin layer 150 of porous SiOC or GeOC intended to form a sock to receive or accommodate a metal contact 160.

Contact 160 is selected from any metal whose atoms are likely to disseminate within material SiOC. In a particular mode of realization, contact 160 is realized in copper. Alternatively, it might be realized in another metal at high diffusion, such as Ag, Al . . . .

As seen in FIG. 2, a contact in copper 160 is thus realized that can diffuse partially within the layer of SiOC 150 depending on settings, in order to modify the characteristics of resistivity of the electric circuit created between the contact 160 and the metallization layers set down (and not shown) on substrate 110.

Contact 160 realizes the upper electrode of a programmable resistive element, which has a second electrode which is the metal or material of via 130.

The structure of contacts coupled to the electrodes can be completed to facilitate the connection of the structure to the outside. Contacts can be made by any metallic material, such as gold, aluminum and its alloys, tungsten or copper.

The resistive element above described can be associated with any access transistor and the whole realizes then a full memory cell, whose electric diagram is shown in FIG. 4.

To control the phenomenon of electro-migration of copper atoms within the layer SiOC 150 (and consequently the resistivity of that layer), the power supplied to the memory cell is modified. The power can be modified in particular by applying an electric field, a current, or a stage of heating during a phase of writing and, more specifically, a joint action of an electric field and temperature.

The result is a modification of resistivity parameters which is measured by means of amplifiers of appropriate reading. Indeed, when the layer of SiOC 150 is not contaminated by the copper atoms, there is a resistance with a high value. On the contrary, when the copper atoms diffuse within the layer of SiOC 150 the contact is of relatively low resistance between the copper 160 and the TaN barrier layer 140.

That modification of the resistivity of the memory element enables then, to fix information, either 0 or 1 within that element.

The memory element described can be used to store information and can then be used to realize electronic memories. In particular, the cell can advantageously be substituted to other know devices, such as DRAM, SRAM, PROM, EPROM, EEPROM memories or any combination of these.

To realize the reading operations an access transistor is associated with a memory element, thereby creating a full memory cell.

First Mode of Realization: MOS Transistor

Figure 3:
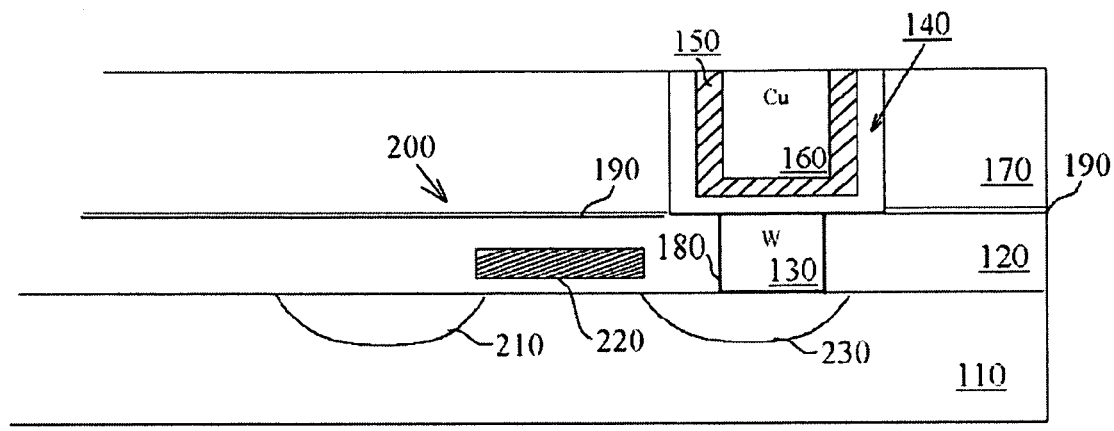
FIG. 3 illustrates the schematic diagram of the association of the FIG. 2 structure to form a memory cell.

A first mode of realization of a memory according to one embodiment is based on a structure of type NMOS, allowing to economically manufacture with a certain relative density, and is illustrated in FIGS. 2 and 3 respectively showing a diagram of structure incorporating the memory to a MOS transistor and its equivalent electrical diagram.

In FIG. 3 the memory cell includes an access transistor, for example NMOS, having a drain, a source and a gate, respectively represented by letters D, S and G in FIG. 4 and by regions 230, 220, and 210 in FIG. 3.

Drain 230 is electrically connected to the lower electrode of the memory element 100 whose upper electrode 180 is connected to potential ES.

Those of skill in the art may fix values of potential differences according to the technology.

As can be seen, such a structure is particularly reduced since one NMOS transistor may achieve a single memory cell.

The reading operation of the content of such a memory is performed in a classical way by applying a potential difference between the ES & S terminals and measuring the current flowing through this path. If the current is very low, this means that the memory element 100 has conductivity particularly low, representative of an information type "0" for example; in the opposite case, the conductivity will be higher, and information "1" will be read.

Second Mode of Realization: Bipolar Transistor

A second mode of realization of a memory according to one embodiment is based on a bipolar transistor structure which enables reduction of the space occupied by the memory cell and has the advantage of a higher density. Clearly, one skilled in the art may adapt the just described scheme by using bipolar transistors, with tunnel effect and diode device.

Figure 5:
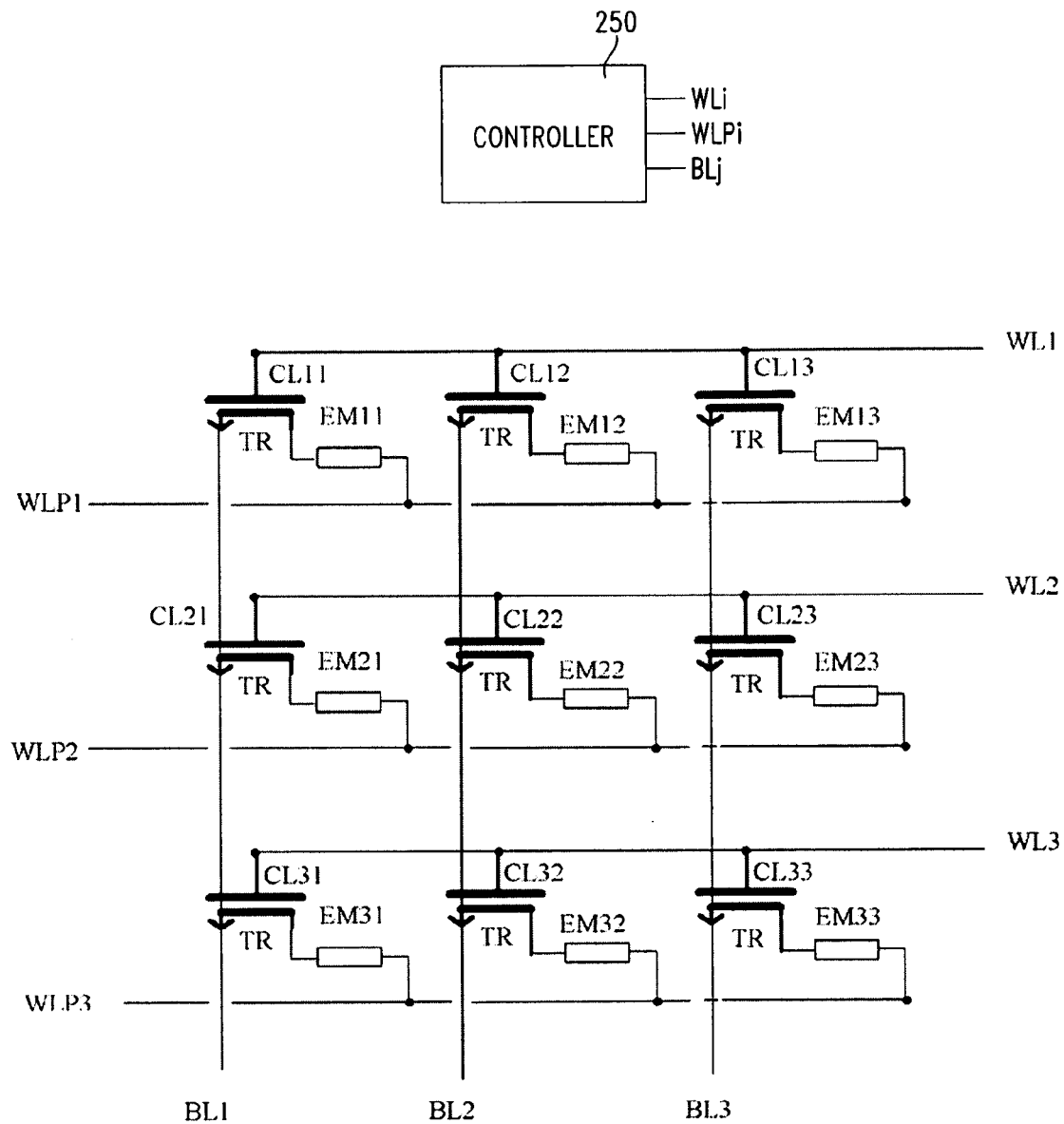
FIG. 5 illustrates a matrix organization of memory cells to realize a memory map MM.

FIG. 5 illustrates a way to organize a set of memory cells, such as those described previously, in order to realize a memory map organized, on one side, in first groups (by rows) and, on the other, in second groups (by columns).

As of the first groups, we see that the first row contains the group formed by cells CL11, CL12 and CL13, while the second row is formed by cells CL21, CL22 and CL33 and that the third row is formed by cells CL31, CL32 and CL33.

Each first group (i.e., group formed by row CL11, CL12 and CL13) comprises cells whose transistor gates are connected together by a first metallization WLi (i=1 for the first row, i=2 for the second row and i=3 for the third row). Moreover, the upper electrodes ES of the memory elements EM(i) are linked together by a second metallization WLPi (i=1 for the first row, i=2 for the second row and i=3 for the third row).

As of the second groups, we see that each column contains a second group of memory cells CL.

Thus, the first column is formed by the group of cells CL11, CL21, CL31, while the second column is formed by the group CL12, CL22 and CL32 and finally the third column is formed by the group CL13, CL23 and CL33.

Each second group has transistors whose sources are linked together by a third metallization BLj (j=1 for the first column, j=2 for the second column and j=3 for the third column).

The memory device comprises also a controller 250 able, in the programming or the reading mode, to apply the adequate voltages to rows on the first, second and third metallization WLi, WLPi and BLj, in order to allow the desired reading and writing processes. The way to generate the adequate signal of control is well known by those skilled in the art and consequently the logic circuits and the generation of different voltages will not be described in more detail.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A memory structure, comprising:
an access transistor connected in series with a programmable resistive element, wherein the programmable resistive element comprises on a semiconductor substrate:
an insulating layer with a cavity;
a first layer lining lateral surfaces of the cavity and a bottom of the cavity, the first layer being impermeable to a diffusion of metal;
a second layer, made of porous material, positioned in the cavity and having a bottom wall lining an interior bottom surface of the first layer and a lateral wall lining an interior lateral surface of the first layer; and
a third layer of metallic material positioned in the cavity, contacting the bottom and lateral walls of the second layer, and forming a contact electrode susceptible to spread within the porous material of the bottom and lateral walls of the second layer.

2. A memory structure according to claim 1 wherein the first layer is of TaN—TA or TiN—Ti.

3. A memory structure according to claim 2 wherein the second layer is of silicon oxycarbide or germanium oxycarbide.

4. A memory structure according to claim 3 wherein the third layer is of copper, silver or aluminum.

5. A memory structure according to claim 1, comprising an intermediate layer of pre-metal dielectric positioned below the insulating layer, the intermediate layer having a metallic via protected by a barrier layer.

6. A memory structure according to claim 5 wherein the intermediate layer is of PSG, PBSG, SiOC or a silicon nitride and the metallic via is of tungsten.

7. An electrically programmable non-volatile memory device, comprising:
a matrix of memory cells including respective access transistors and respective memory elements, the matrix including:
first groups of cells extending according to a first direction, wherein for each first group, the access transistors of the cells of the first group have respective gates that are connected together by a first metallization, and the memory elements of the cells of the first group have upper electrodes that are connected together by a second metallization, and
second groups of cells all extending according to a second direction, each second group comprising cells whose sources of transistors are connected together by a third metallization, the memory elements being formed in respective cavities of an insulating layer formed on a substrate, each memory element including:
a first layer lining lateral surfaces of the respective cavity and a bottom of the respective cavity, the first layer being impermeable to a diffusion of metal;
a second layer, made of porous material, positioned in the respective cavity and having a bottom wall lining an interior bottom surface of the first layer and a lateral wall lining an interior lateral surface of the first layer; and
a third layer of metallic material positioned in the respective cavity, contacting the bottom and lateral walls of the second layer, and forming a contact electrode susceptible to spread within the porous material of the bottom and lateral walls of the second layer; and
a controller configured to apply selected voltages on the first, second and third metallizations, in order to selectively program each cell.

8. A device according to claim 7 wherein the first layer is of TaN—TA or TiN—Ti.

9. A device according to claim 8 wherein the second layer is of silicon oxycarbide or germanium oxycarbide.

10. A device according to claim 9 wherein the third layer is of copper, silver or aluminum.

11. A device according to claim 7, comprising an intermediate layer of pre-metal dielectric positioned below the insulating layer, the intermediate layer having a metallic via protected by a barrier layer.

12. A device according to claim 11 wherein the intermediate layer is of PSG, PBSG, SiOC or a silicon nitride and the metallic via is of tungsten.

13. A process, comprising:
manufacturing a programmable memory structure, the manufacturing including:
providing a substrate;
depositing an insulating layer with a cavity;
setting down a first layer lining lateral surfaces of the cavity and a bottom of the cavity, the first layer being impermeable to a diffusion of metal;
setting down a second layer, made of porous material, in the cavity and having a bottom wall lining an interior bottom surface of the first layer and a lateral wall lining an interior lateral surface of the first layer; and
setting down a third layer of metallic material in the cavity, the third layer contacting the bottom and lateral walls of the second layer, and forming a contact electrode susceptible to spread within the porous material of the bottom and lateral walls of the second layer.

14. A process according to claim 13 wherein the insulating layer is formed of silicon oxycarbide.

15. A process according to claim 14 wherein the said first layer is formed of TaN—TA or TiN—Ti.

16. A process according to claim 15 wherein the second layer is of silicon oxycarbide.

17. A process according to claim 16 wherein the third layer is made of copper.

18. A process according to claim 13, comprising:
achieving an intermediate layer of pre-metal dielectric above the substrate prior to depositing the insulating layer;
achieving in the intermediate layer a well exposing a determined surface of the substrate;
depositing a thin layer of TiN on sidewalls of the well and on a bottom of the well in order to form a protective barrier of the intermediate layer;
depositing a metallic layer on the thin layer;
performing a chemical mechanical planarization on the intermediate layer; and
depositing a barrier of material SiC on the intermediate layer.

19. A process according to claim 13, wherein:

the insulating layer is of silicon oxycarbide;

the cavity has a cross-section greater than a cross-section of the well;

the first layer is composed of Ta or TaN;

the second layer is of silicon oxycarbide and is a programmable resistive element; and the third layer is of copper and is an upper contact electrode for the programmable resistive element.

\* \* \* \* \*